(12) United States Patent
Krivokapic et al.

(10) Patent No.: US 6,362,061 B1
(45) Date of Patent: Mar. 26, 2002

(54) METHOD TO DIFFERENTIATE SOURCE/DRAIN DOPING BY USING OXIDE SLIVERS

(75) Inventors: Zoran Krivokapic, Santa Clara; Sunny Cherian, San Jose, both of CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 0 days.

(21) Appl. No.: 09/566,659

(22) Filed: May 8, 2000

(51) Int. Cl.[7] .................. H01L 21/336; H01L 21/426
(52) U.S. Cl. ................. 438/303; 438/302; 438/525
(58) Field of Search .................. 438/302, 303, 438/525, 531, 944, FOR 170, FOR 169; 257/900

(56) References Cited

U.S. PATENT DOCUMENTS

| | | | |
|---|---|---|---|
| 5,270,226 A | * 12/1993 | Hori et al. | 438/302 |
| 5,595,919 A | * 1/1997 | Pan | 438/302 |
| 5,661,049 A | * 8/1997 | Lur et al. | 438/303 |
| 5,736,446 A | * 4/1998 | Wu | 438/305 |
| 5,915,182 A | * 6/1999 | Wu | 438/299 |
| 6,124,176 A | * 9/2000 | Togo | 438/305 |

OTHER PUBLICATIONS

The IEEE Standard Dictionary of Electrical and Electronics Terms, 6th ed, IEEE Std 100–1996, pp. 146.*

* cited by examiner

Primary Examiner—Olik Chaudhuri
Assistant Examiner—Marcos D. Pizarro-Crespo
(74) Attorney, Agent, or Firm—Skjerven Morrill MacPherson LLP; Edward C. Kwok, Esq.

(57) ABSTRACT

A method of manufacturing devices with source, drain and extension regions is provided. To achieve in the extensions a depth and dopant levels different from the source and drain regions, a channel-shaped oxide structure is formed surrounding a polysilicon gate. The channel-shaped oxide structures forms an implantation barrier over the extensions region. Thus, when the source and drain implantation is carried out at a given energy, the extension regions receives a 35–40 percent dopant dose, as compared to the dose received by the source region and the drain region.

7 Claims, 2 Drawing Sheets

METHOD TO DIFFERENTIATE SOURCE/DRAIN DOPING BY USING OXIDE SLIVERS

BACKGROUND OF THE INVENTION

1. Field of the Invention

The present invention relates to integrated circuit manufacturing. More particularly, the present invention relates to reducing the steps in making Metal Oxide Semiconductor Field-Effect Transistor(hereinafter, MOSFET) source drain implants with extensions.

2. Discussion of the Related Art

Typically, a MOSFET circuit is fabricated from a single-crystal silicon substrate of a silicon wafer, which may be doped p-type or n-type. The significant steps in manufacturing a MOSFET circuit are described briefly in the following as background information. Initially, the surface of the silicon wafer is exposed to steam or dry oxygen at high temperature to form an oxide layer on the substrate. Subsequently, a layer of polycrystalline silicon (polysilicon hereafter) is deposited and patterned to form a gate structure. Thereafter, the source and the drain regions are formed by implanting dopants into the silicon substrate. However, if the source and the drain regions have extensions, and a different depth or doping levels are desired for such extensions, separate steps are required to form the source and drains and the extensions. However, high efficiency can be achieved if both the source and the drain regions and their respective extensions can be formed in one step using only one mask.

SUMMARY OF THE INVENTION

The present invention provides a method for manufacturing the source and the drain regions and their extensions in a single masking step. The method manufactures MOSFET devices in which the source and drain regions are associated with extension regions having depth and dopant levels different from those of the source and the drain regions.

A method of the present invention includes making a channel-shaped oxide structure surrounding the polysilicon gate. The oxide structure forms an implantation barrier for subsequent dopant implantation into the extension regions. Thus, when the source and drain regions are implanted at a given energy level, the extension regions are also implanted, but to a lower depth and a lower dopant concentration relative to the depth and dopant concentration of the source and the drain regions.

DETAILED DESCRIPTION OF THE PREFERRED EMBODIMENTS

Figure 1:
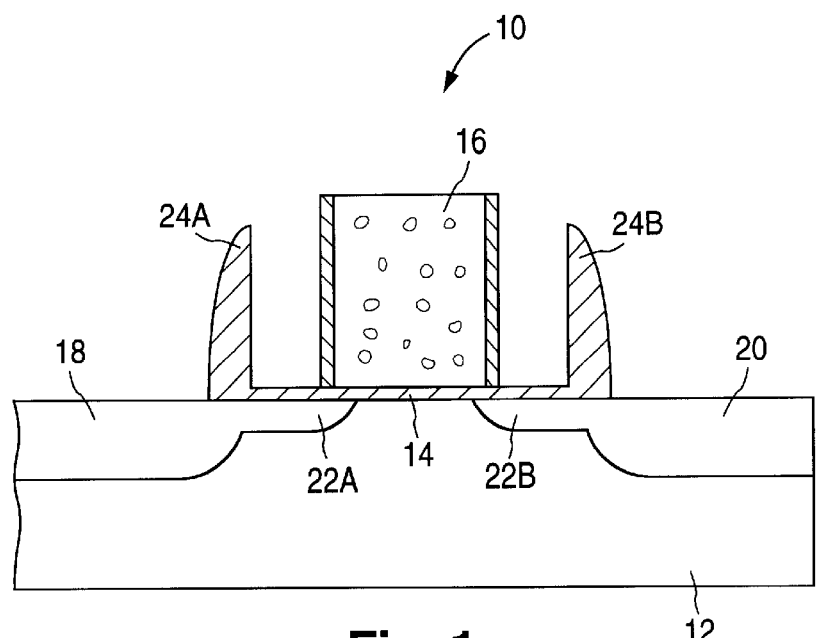
FIG. 1 illustrates an intermediate structure 10 under a manufacturing process, in accordance with one embodiment of the present invention.

FIG. 1 illustrates an intermediate structure 10, in a process for manufacturing MOSFETs, in accordance with one embodiment of the present invention. In a typical integrated circuit, millions of MOSFETs are formed in a single silicon die, and many silicon dies are formed. Structure 1O is drawn for illustrative purpose only and not to scale. Delineations between the various doped regions are illustrative rather than realistic depictions. As shown in FIG. 1, structure 10 includes silicon substrate 12, which is doped either n-type or p-type. On top of silicon substrate 12 is provided gate oxide layer 14. Polysilicon gate structure 16 is formed on gate oxide layer 14. On opposite sides of gate structure 16 is formed source region 18 and drain region 20, including their respective extensions 22A and 22B. In this embodiment, source region 18 and extension 22A and drain region 20 and extension 22B have different dopant levels and extensions 22A and 22B are shallower than corresponding source region 18 and drain region 20. FIG. 1 also shows slivers 24A and 24B that form a structure surrounding gate structure 16. Slivers 24 A and 24 B aid in the implanting step forming source region 18 and drain region 20. In the same implanting step extensions 22A and 22B are also formed. Thus, the present invention provides source region 18, drain region 20 and their respective extensions 22A and 22B in one single masking step.

Figure 2A:
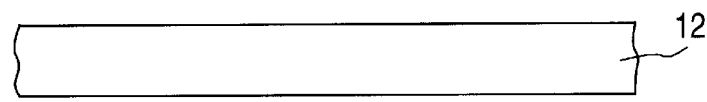
FIGS. 2a–2j illustrate steps the manufacturing process forming structure 10 of FIG. 1 in accordance with the present invention.
Figure 2B:
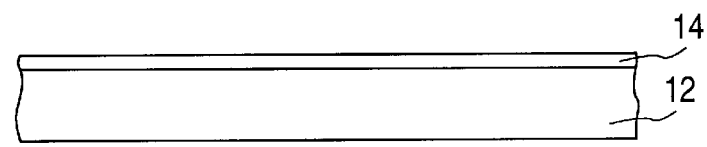
Figure 2C:
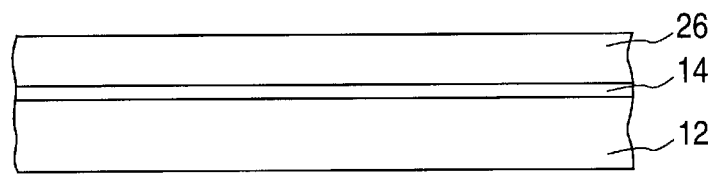
Figure 2D:
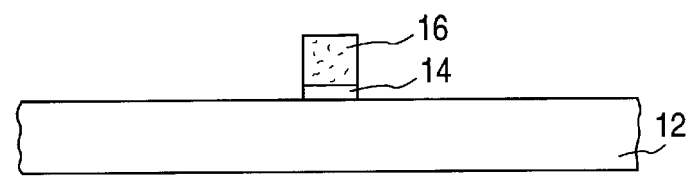
Figure 2E:
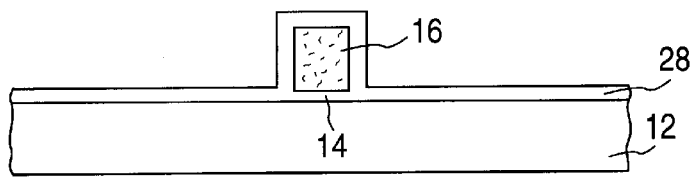
Figure 2F:
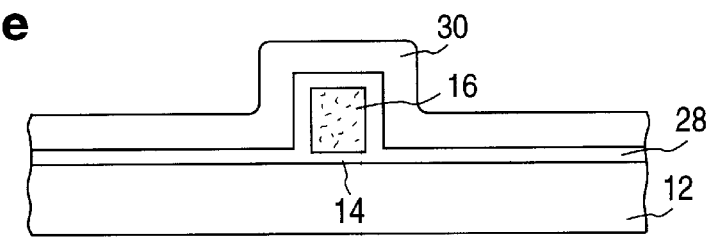
Figure 2G:
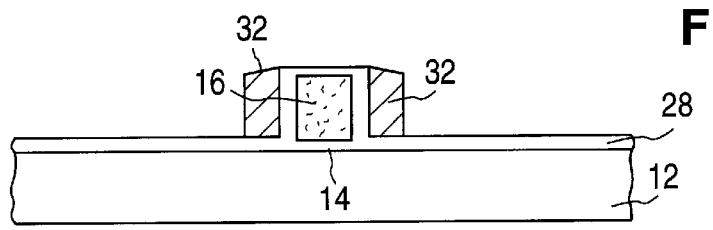
Figure 2H:
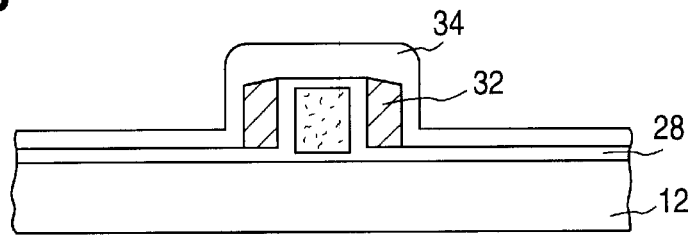
Figure 2I:
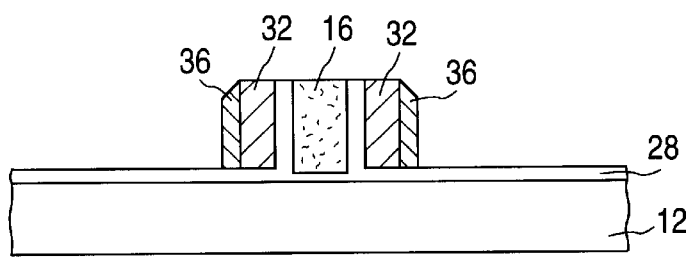
Figure 2J:
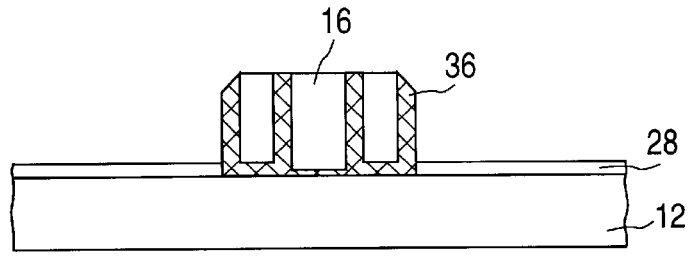

FIGS. 2a–2j illustrates the various steps in manufacturing structure 10 of FIG. 1. First, conventional N-doped silicon substrate 12 is provided (FIG. 2a). Then, as illustrated in FIG. 2b, oxide layer 14 (e.g., 1.5–2.5 nm thick) is provided on silicon substrate 12. Next, polysilicon layer 26 is provided in a conventional manner on oxide layer 14 (FIG. 2c). Polysilicon layer can be provided, for example, pre-doped with a thickness of 125–175 nm. Polysilicon layer 26 is then patterned to form gate structure 16 (FIG. 2d). Oxide layer 14 is also substantially removed from the areas exposed after removal of polysilicon from polysilicon layer 26. Next, oxide layer 28, approximately 10–15 nm thick, is formed (FIG. 2e) over gate structure 16 and the exposed areas. Then, nitride layer 30 is formed over the oxide layer 28 (FIG. 2f). Nitride layer 30 can be deposited, for example, to approximately 70–120 nm thick using a chemical vapor deposition process. Nitride layer 30 is then anisotropically etched to form spacers 32 of approximately 50–85 nm wide, as illustrated in FIG. 2g. Then, oxide layer 34 is formed over nitride spacers 32 and oxide layer 28 atop gate structure 16 (FIG. 2h). A portion of oxide layer 34 and a portion of oxide layer 28 atop gate structure 16 are etched back to form slivers 36 on the outside of nitride spacers 32. The resulting structure is illustrated in FIG. 2i. Thus, the structure in FIG. 2i has gate structure 16 surrounded by a channel-shaped oxide layer, with the channel filled by the material of nitride spacers 32. Next, the nitride in nitride layers 32 is removed using hot phosphoric acid (FIG. 2j). Next, dopants are implanted into silicon substrate 12 to form source region 18, drain region 20, and extensions 22A and 22B, as shown in FIG. 1.

In the implantation step forming source region 18, drain region 20 and extensions 22A and 22B, dopants are implanted into silicon substrate 12 using implantation steps from four rotated positions of the wafer, and at a tilt angle of 15–30°. For a N-type implant (i.e., arsenic or phosphorus), an energy of 15–25 KeV can be used. For a P-type implant (e.g., $BF_2$), an energy of of 10–20 KeV can be used. Masked by structure 10, extensions 22A and 22B receives approximately a 35–40 percent dose relative to the dose received at source region 18 and drain region 20.

The exemplary embodiments of the invention disclosed above are illustrative and not limiting. Other embodiments of this invention are possible within the scope of the invention.

We claim:

1. A method of making a semiconductor device on a substrate having a principal surface and being doped to a first conductive type, comprising the acts of:

forming a gate insulating layer on the principal surface;

forming a gate electrode on the gate insulating layer;

forming a masking structure on the gate insulating layer adjacent to and spaced apart from the sidewalls of the gate electrode; and implanting a dopant of a second conductivity type through the masking structure and the gate insulating layer at substantially the same energy, such that a doped region is formed having a first portion at a first depth in the substrate and extending from each sidewall of the gate electrode to the adjacent masking structure, and a second portion at a second greater depth in the substrate extending laterally outwards from the first portion.

2. The method of claim 7, wherein forming the masking structure comprises:

forming a first oxide layer over the gate electrode and the principal surface;

depositing a nitride layer over the first oxide layer;

etching the nitride layer to form nitride spacers;

depositing a second oxide layer over the nitride spacers and the first oxide layer;

etching the second oxide layer and the first oxide layer; and removing the nitride spacers.

3. The method of claim 1, further comprising rotating the substrate, while implanting the dopant of the second conductivity type in the substrate.

4. The method of claim 3, further comprising implanting the dopant at a tilt angle of approximately 15–30 degrees from a line perpendicular to a plane defined by the principal surface of the substrate.

5. The method of claim 3, wherein rotating the substrate includes performing a plurality of rotations.

6. The method of claim 1, wherein the dopant of the second conductivity type is N-type dopant and is implanted at an energy of approximately 15–25 keV.

7. The method of claim 1, wherein the dopant of the second conductivity type is P-type dopant and is implanted at an energy of approximately 10–20 keV.

* * * * *